United States Patent [19]

Feliz et al.

[11] Patent Number: 5,128,631
[45] Date of Patent: Jul. 7, 1992

[54] OPERATIONAL AMPLIFIER HAVING IMPROVED SLEW RATE

[75] Inventors: George F. Feliz; Robert C. Dobkin, both of Santa Clara County, Calif.

[73] Assignee: Linear Technology Corporation, Milpitas, Calif.

[21] Appl. No.: 652,053

[22] Filed: Feb. 6, 1991

[51] Int. Cl.⁵ .......................... H03F 3/26; H03F 3/45
[52] U.S. Cl. ......................................... 330/255; 330/265
[58] Field of Search ............... 330/255, 260, 263, 265, 330/294, 301, 311

[56] References Cited
U.S. PATENT DOCUMENTS 4,467,288  8/1984  Strickland ................... 330/271 X
4,701,720  10/1987  Monticelli ....................... 330/260

Primary Examiner—Steven Mottola
Attorney, Agent, or Firm—Flehr, Hohbach, Test, Albritton & Herbert

[57] ABSTRACT

An operational amplifier having input and output stages with positive capacitive feedback to the output stage derived from a point in the circuit where the voltage is proportional to the output voltage.

8 Claims, 2 Drawing Sheets

OPERATIONAL AMPLIFIER HAVING IMPROVED SLEW RATE

This invention relates generally to operational amplifiers and more particularly to operational amplifiers having an enhanced slew rate.

BACKGROUND OF THE INVENTION

Positive capacitive feedback to increase the slew rate of operational amplifiers is known. U.S. Pat. No. 4,701,720 teaches the use of positive capacitive feedback to increase the tail current of an input differential pair when the output slew is negative. The feedback increases the negative slew rate so that the positive and negative slew rates are comparable.

The primary disadvantage of all prior art operational amplifiers employing capacitive feedback to improve the slew rate is that the feedback capacitors are connected directly to the output. The amplifier is therefore loaded by the feedback capacitance and by parasitics associated with the feedback circuit. The output loading reduces the bandwidth and the phase margin of the amplifier, as well as reducing the maximum current which is delivered to the load.

OBJECTS AND SUMMARY OF THE INVENTION

It is an object of this invention to provide an operational amplifier having improved positive and negative slew rate.

It is another object of the invention to provide an operational amplifier in which the circuitry providing increased slew rate does not load the output of the amplifier.

It is another object of the invention to provide an operational amplifier in which the slew rate is boosted without significantly increasing power consumption.

It is a further object of the invention to provide an operational amplifier in which the output is buffered from the feedback circuit.

These and other objects are achieved by an amplifier which includes an output stage comprising a pair of complementary transistors coupled to the output, driven by a pair of complementary drive transistors which are coupled to a voltage excursion point whose voltage is proportional to the voltage of the output and which provides a feedback signal which is coupled to said complementary drive transistors to increase the drive to said output transistors to thereby increase the positive and negative slew rate of the said amplifier.

BRIEF DESCRIPTION OF THE DRAWINGS

The foregoing and other objects of the invention will be more clearly understood from the following description read in association with the accompanying drawing of FIGS. 1 and 2.

DETAILED DESCRIPTION OF PREFERRED EMBODIMENT

Figure 1:
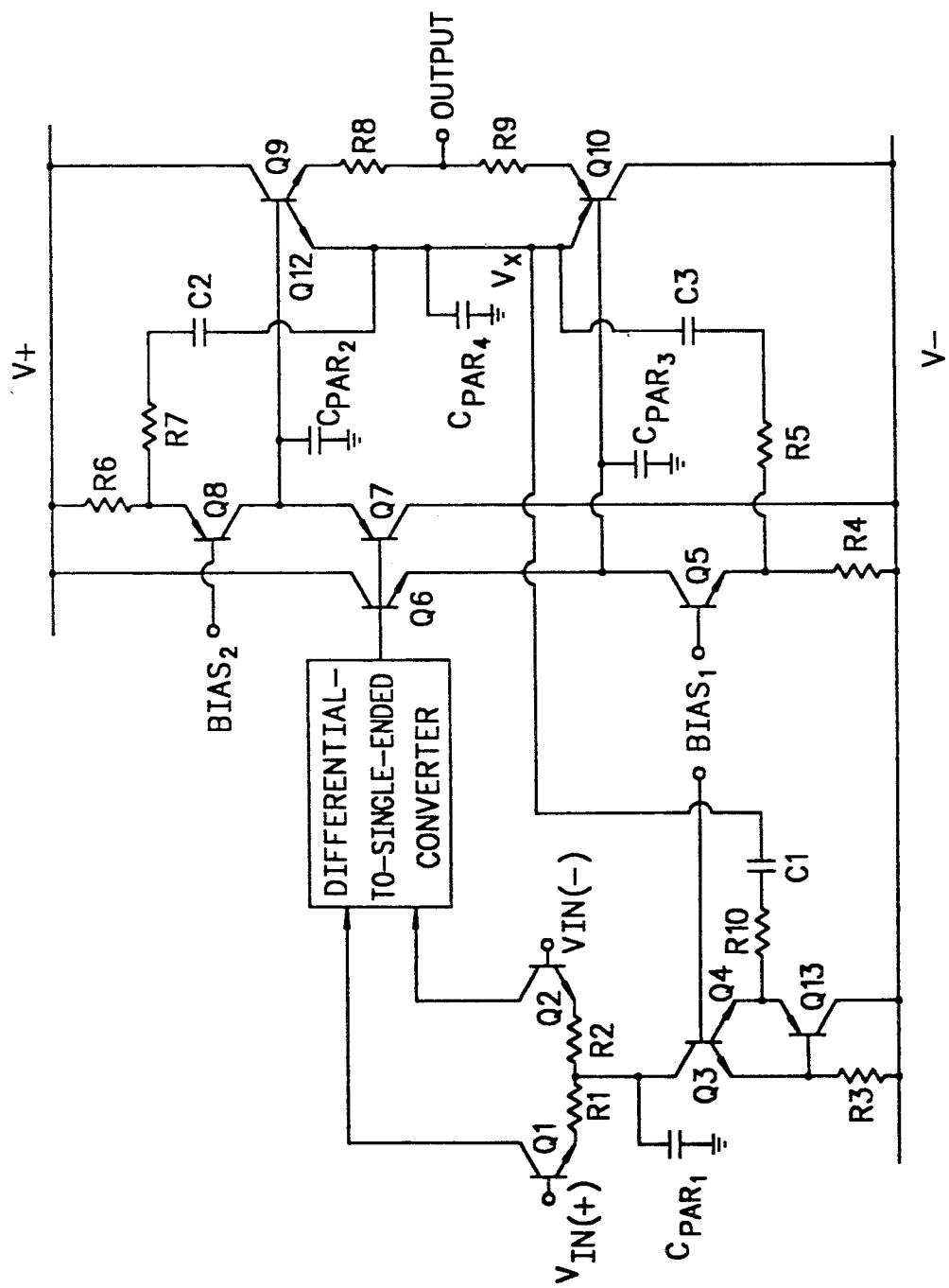

Referring to FIG. 1, the amplifier has a differential input connected to transistors $Q_1$ and $Q_2$ which receive the input signal at their bases and provide a differential output signal at their collectors. The differential output signal is supplied to a differential to single-ended converter 11. Resistors $R_1$ and $R_2$ return the emitters of the input pair to the collector of $Q_3$ which causes the transistors to function as a differential pair. Resistors $R_1$ and $R_2$ are optional and can be eliminated if other circuit components are correctly chosen. Complementary transistors $Q_6$ and $Q_7$ are coupled as emitter followers to drive the bases of the pair of complementary output transistors $Q_9$ and $Q_{10}$. The bases of transistors $Q_5$ and $Q_8$ are connected to a bias source and are coupled to the emitters of transistors $Q_6$ and $Q_7$ and act as high impedance current sources for the emitters of the transistors $Q_6$ and $Q_7$ respectively. The output complementary transistors $Q_9$ and $Q_{10}$ have their emitters coupled to the output terminal.

In accordance with the invention, capacitive feedback is employed for improving the slew rate. In this invention the capacitive feedback is obtained from a second pair of emitters of the transistors $Q_9$ and $Q_{10}$ driving series resistors and capacitors $C_2$, $R_7$ and $C_3$, $R_5$, providing feedback to the emitters of the transistors $Q_8$ and $Q_5$ respectively. The capacitive feedback signal can be obtained from other points in the circuit where the voltage excursions are proportional to the output voltage. Series capacitor $C_1$ and resistor $R_{10}$ provide feedback to transistor $Q_4$. The action of this positive feedback is to increase the slew rate of the amplifier.

Figure 2:
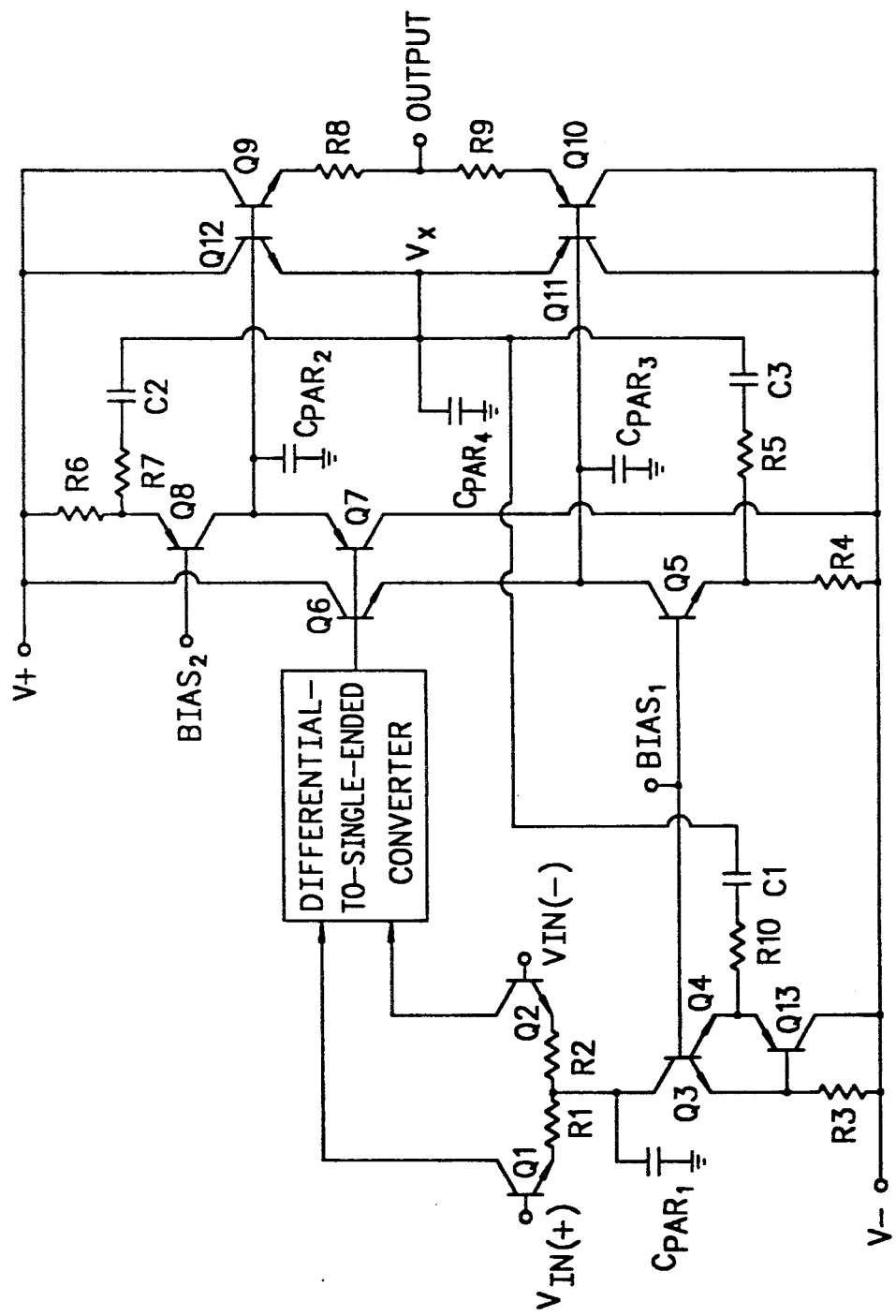
Figure 1:
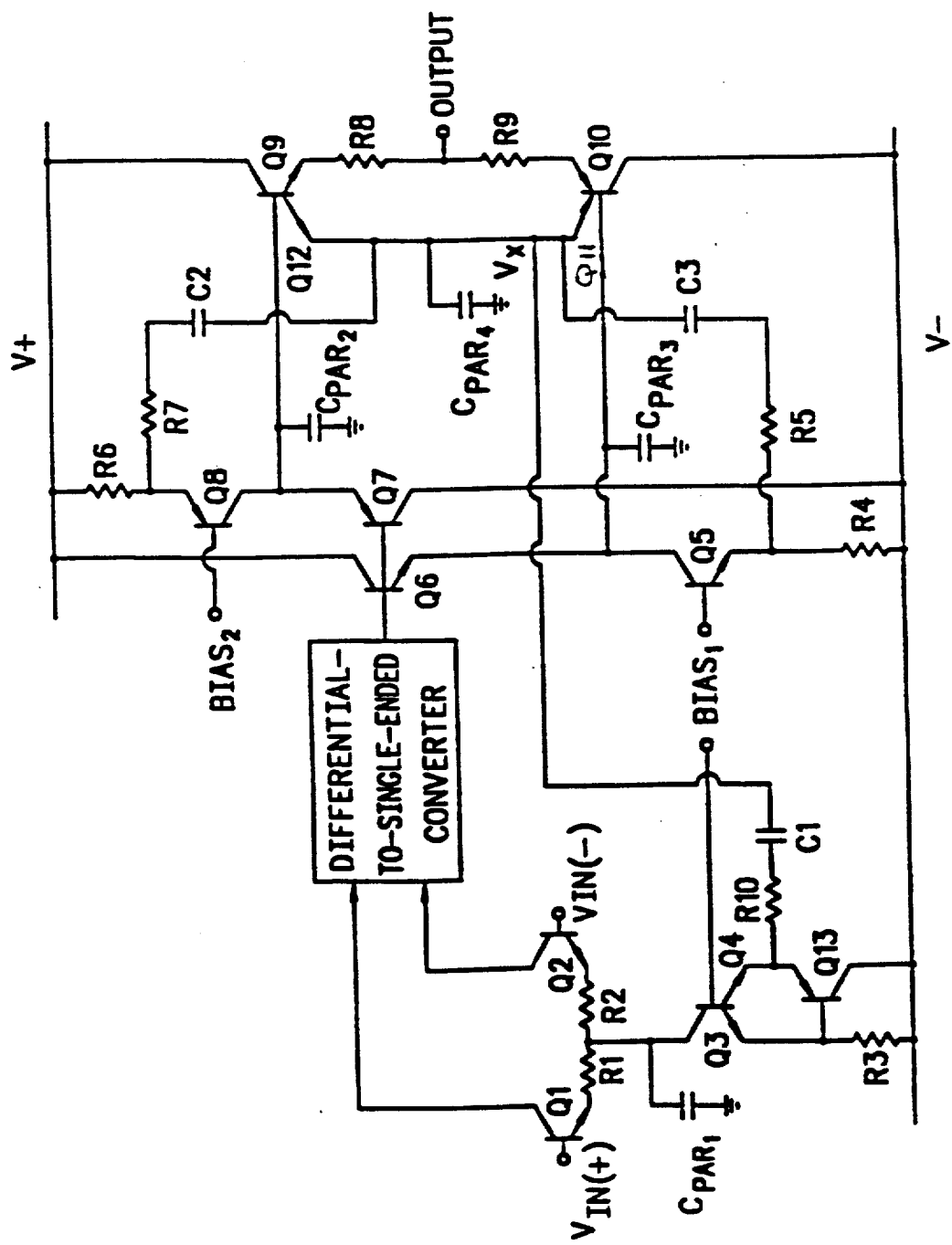

Operation of the invention will be more clearly understood from the following description. As described above the feedback circuitry consists of $Q_4$, $Q_5$, $Q_8$, $C_1$, $C_2$, $C_3$, $R_5$, $R_7$ and $R_{10}$. feedback is produced at the emitters of $Q_{11}$ and $Q_{12}$ and is in phase with the output. The feedback signal is related to the output signal but does not load the output circuit. Transistors $Q_{11}$ and $Q_{12}$ can be formed by separate emitters on the output transistors $Q_9$ or $Q_{10}$ or they can be separate devices as shown in FIG. 2. In either event, the feedback circuit is buffered from the output complementary transistors $Q_9$ and $Q_{10}$. The buffered signal drives $C_1$, $C_2$, $C_3$, and their current limiting resistors $R_5$, $R_7$, and $R_{10}$.

The slew rate at $V_x$ will be almost the same as the output voltage and in phase with the output voltage. For positive going signals at $V_{out}$ and $V_x$, $Q_{12}$ will source current into the feedback capacitors which will turn off $Q_4$, $Q_5$ and will increase the current in $Q_8$. With the increase in $Q_8$ current, $C_{par2}$ can be charged and the base of $Q_9$, $Q_{12}$ can slew positive more quickly. Since the extra current is present only for AC signals, the DC bias current of $Q_8$ can be reduced to lower total power dissipation of the circuit, but still be able to drive $C_{par2}$ positive so that the node does not limit overall slew rate. Turning off $Q_5$ with $C_3$ and $R_5$ slightly aids in raising the voltage at the base of $Q_{10}$ and $Q_{11}$. The effect is small as $C_{par3}$ is charged by the emitter of $Q_6$ for positive going signals. The turn-off of $Q_4$ has little effect as it is normally off and the tail current of degenerated differential pair $Q_1$, $Q_2$ is not affected for positive going outputs.

$Q_{13}$ is used as a clamp to prevent emitter-base breakdown of $Q_4$ which would allow the current in $C_1$, $R_{10}$ to flow into the $Bias_1$ line. For negative going output signals (and $V_x$), $Q_{11}$ sinks current through the three feedback networks. The current in $Q_5$ will increase in order to slew $C_{par3}$ in a negative direction in a manner analogous to $Q_8$ for positive signals. The DC current in $Q_5$ can therefore be reduced as well which further lowers power consumption of the circuit. Transistor $Q_8$ cuts off in a manner similar to that of $Q_5$ for positive signals with the effect on slew rate of $C_{par2}$ being small as it is discharged by the emitter of $Q_7$. The last effect is the turning on of $Q_4$ by $C_1$, $R_{10}$ for negative going signals aids in slewing $C_{par1}$ in a negative direction. This effect is important for noninverting configurations. For positive going inputs transistor $Q_1$ drives $C_{par1}$ and its current increases which improves the positive slew rate. For negative going inputs, $Q_3$ must pull $C_{par1}$ down which reduces the available tail current for $Q_1$. $Q_2$ which decreases the amplifier negative slew rate. The boost circuit replaces some of the lost tail current through $Q_4$ during negative going outputs which tends to equalize the slew rates and increases the effective full power bandwidth for noninverting configurations.

The key features of this invention are the buffering of the capacitive positive feedback loops from the output, and the use of the boost to reduce supply current for the amplifier for a given slew rate.

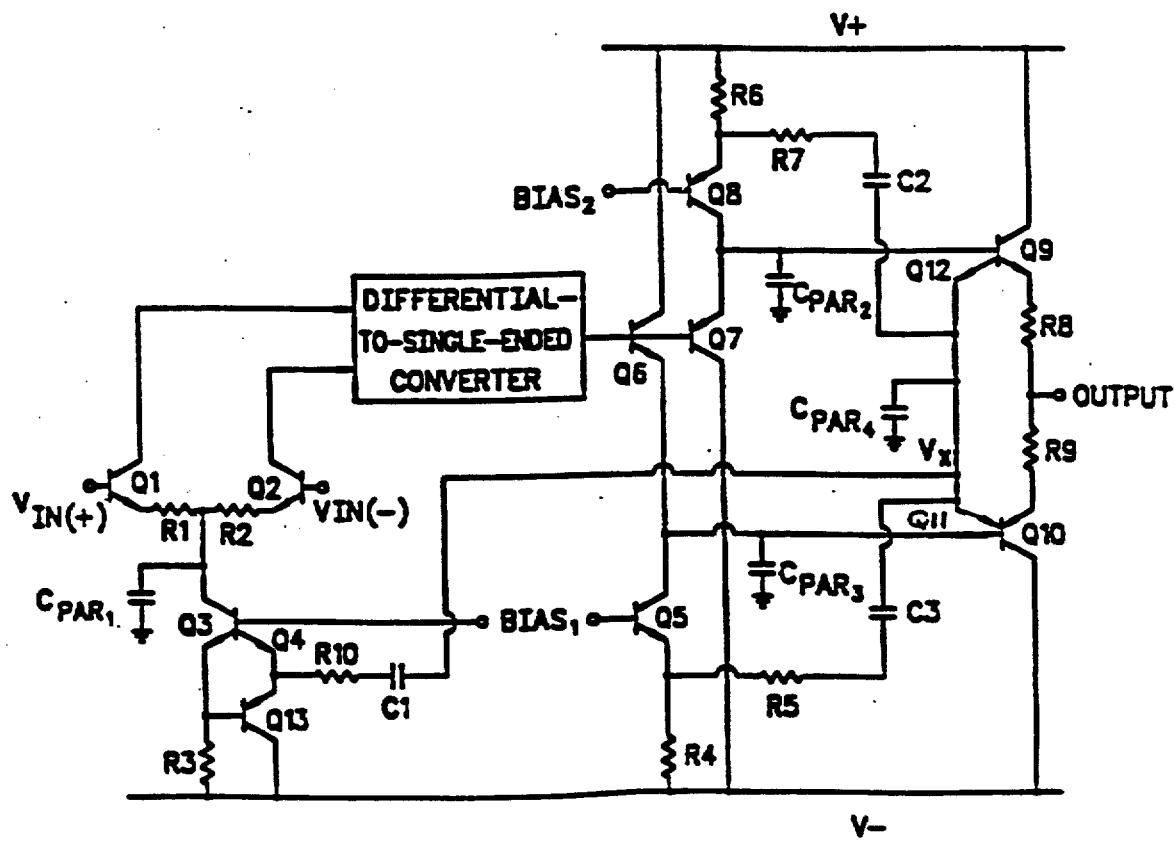

What is claimed is:

1. An amplifier including an input stage for receiving an input signal and an output stage, said output stage including a pair of complementary transistors connected to an output terminal, and capacitive feedback means coupled to a point other than said output terminal, said capacitive feedback means buffered from said complementary transistors, said capacitive feedback means providing positive feedback to said complementary output transistors to increase their slew rate.

2. An amplifier including an input stage for receiving an input signal and an output stage, said output stage including a pair of complementary transistors connected to an output terminal, and capacitive feedback means coupled to a point other than said output terminal, providing positive feedback to said complementary output transistors to increase their slew rate, wherein said input stage includes a pair of differentially connected input transistors and additional capacitive means coupled to said point and providing positive feedback to said differentially connected input transistors.

3. An amplifier as in claim 1 in which said capacitive feedback means comprises a pair of complementary drive transistors coupled to capacitors connected to said point.

4. An amplifier including an input stage for receiving an input signal, an output stage, said output stage including a pair of complementary transistors connected to an output terminal, and capacitive feedback means coupled to a point other than said output terminal, providing positive feedback to said complementary output transistors to increase their slew rate, said capacitive feedback means including a pair of complementary drive transistors coupled to capacitors connected to said point, said output transistors and said complementary drive transistors having emitter, base and collector terminals, the emitter terminals of said output transistors connected to the output terminal, the emitters of said complementary drive transistors connected to the bases of said output transistors and the emitters of said drive transistors 5. An amplifier as in claim 4 in which said point comprises emitters of an additional pair of complementary transistors connected in parallel to the output transistors.

6. An amplifier as in claim 4 in which said point comprises separate emitters on the output transistors.

7. An amplifier including an input stage and an output stage, said output stage comprising a pair of complementary transistors having base, emitter an collector terminals with the emitter terminals connected to an output terminal, a pair of complementary drive transistors having base, emitter and collector terminals with their emitter terminals connected to drive the base terminals of said output transistors, a pair of current source transistors having base, emitter, and collector terminals with their collector terminals connected to the emitter terminals of said drive transistors, an additional emitter formed in each of said output transistors, capacitive feedback means coupled between said additional emitters and the emitters of said current source transistors and said input stage comprising a pair of differentially connected input transistors and capacitive feedback means coupled to said additional emitters to provide positive feedback to said input transistors.

8. An amplifier including an input stage and an output stage, said output stage comprising a pair of complementary transistors having base, emitter and collector terminals with the emitter terminals connected to an output terminal, a pair of complementary drive transistors having base, emitter and collector terminals with their emitter terminals connected to drive the base terminals of said output transistors, a pair of current source transistors having base, emitter, and collector terminals with their collector terminals connected to the emitter terminals of said drive transistors, an additional pair of complementary transistors, having base, emitter and collector terminals, connected in parallel to said output transistors, capacitive feedback means coupled between the emitter terminals of said additional pair of complementary transistors and the emitter terminals of said pair of current source transistors and said input stage comprising a pair of differentially connected input transistors and capacitive feedback means coupled to the emitter terminals of said additional pair of complementary transistors to provide positive feedback to said input transistors.

* * * * *

UNITED STATES PATENT AND TRADEMARK OFFICE
CERTIFICATE OF CORRECTION

Page 1 of 3

PATENT NO. : 5,128,631
DATED : July 7, 1992
INVENTOR(S) : Geroge F. Feliz et al

It is certified that error appears in the above-indentified patent and that said Letters Patent is hereby corrected as shown below:

The title page should be deleted and substitute therefor the attached title page.

In the drawings, delete Figure 1, and substitute therefor the drawing sheet consisting of Figure 1, as shown on the attached page.

Column 4, line 3, after "transistors" add --coupled to said capacitors.--.

Column 4, line 12, replace "an" with --and--.

Signed and Sealed this

Thirtieth Day of November, 1993

Attest:

BRUCE LEHMAN

*Attesting Officer*     *Commissioner of Patents and Trademarks*

United States Patent [19]

Feliz et al.

[11] Patent Number: 5,128,631
[45] Date of Patent: Jul. 7, 1992

[54] OPERATIONAL AMPLIFIER HAVING IMPROVED SLEW RATE

[75] Inventors: George F. Feliz; Robert C. Dobkin, both of Santa Clara County, Calif.

[73] Assignee: Linear Technology Corporation, Milpitas, Calif.

[21] Appl. No.: 652,053

[22] Filed: Feb. 6, 1991

[51] Int. Cl.⁵ .......................... H03F 3/26; H03F 3/45
[52] U.S. Cl. ................................... 330/255; 330/265
[58] Field of Search ............... 330/255, 260, 263, 265, 330/294, 301, 311

[56] References Cited

U.S. PATENT DOCUMENTS 4,467,288  8/1984  Strickland .................... 330/271 X
4,701,720 10/1987  Monticelli ....................... 330/260

Primary Examiner—Steven Mottola
Attorney, Agent, or Firm—Flehr, Hohbach, Test, Albritton & Herbert

[57] ABSTRACT

An operational amplifier having input and output stages with positive capacitive feedback to the output stage derived from a point in the circuit where the voltage is proportional to the output voltage.

8 Claims, 2 Drawing Sheets